United States Patent

Nedwick et al.

[11] Patent Number: 5,804,254
[45] Date of Patent: Sep. 8, 1998

[54] METHOD FOR FLEXIBILIZING CURED UREA FORMALDEHYDE RESIN-BOUND GLASS FIBER NONWOVENS

[75] Inventors: Paul Nedwick, Lansdale, Pa.; Bobby Carol Osborne, Marietta, Ga.

[73] Assignee: Rohm and Haas Company, Phila., Pa.

[21] Appl. No.: 874,712

[22] Filed: Jun. 13, 1997

Related U.S. Application Data

[60] Provisional application No. 60/021,426, Sep. 7, 1996.
[51] Int. Cl.⁶ .................................................. B05D 3/02
[52] U.S. Cl. ................................................... 427/389.8
[58] Field of Search ...................................... 427/389.8

[56] References Cited

U.S. PATENT DOCUMENTS

| | | | |
|---|---|---|---|
| 4,859,508 | 8/1989 | Pangrazi et al. | 427/389.9 |
| 5,334,648 | 8/1994 | Drews et al. | 524/512 |
| 5,670,585 | 9/1997 | Taylor et al. | 525/508 |

*Primary Examiner*—Erma Cameron
*Attorney, Agent, or Firm*—Ronald D. Bakule

[57] ABSTRACT

A method for flexibilizing a glass fiber nonwoven bound with a cured urea formaldehyde resin binder is provided in which the binder includes a cured urea formaldehyde resin and 0.5–5% by weight, based on the weight of the urea formaldehyde resin, of a water-soluble polymer comprising 40–100% by weight, based on polymer weight, of a polymerized ethylenically unsaturated carboxylic acid monomer, the polymer having a weight average molecular weight from 100,000 to 2,000,000.

2 Claims, No Drawings

METHOD FOR FLEXIBILIZING CURED UREA FORMALDEHYDE RESIN-BOUND GLASS FIBER NONWOVENS

This application claims benefit of U.S. provisional application No. 60/021,426, filed Sep. 7, 1996.

This invention relates to a method for flexibilizing cured urea formaldehyde resin-bound glass fiber nonwovens. More particularly, this invention relates to a method for flexibilizing glass fiber nonwovens bound with cured urea formaldehyde resin binders by admixing with water and a urea formaldehyde resin, 0.5–5% by weight, based on the weight of the urea formaldehyde resin, of a water-soluble polymer comprising 40–100% by weight, based on polymer weight, of a polymerized ethylenically unsaturated carboxylic acid monomer, the polymer having a weight average molecular weight from 100,000 to 2,000,000; applying the aqueous admixture to a glass fiber nonwoven; and heating the admixture to at least 120 C.

The present invention serves to provide a glass fiber nonwoven with improved wet and dry tensile strength and tear strength relative to a glass fiber nonwoven in which a urea formaldehyde resin is used as the sole binder for the mat by incorporating into the urea formaldehyde binder 0.5–5 wt. % by weight, based on the weight of the urea formaldehyde binder, of certain water soluble polymeric polyacid compositions.

U.S. Pat. No. 5,334,648 discloses acrylic, styrene-butadiene, and vinyl chloride copolymer latex modifiers for urea formaldehyde resins, the modifiers used at a level of about 10 wt. %, based on the weight of the urea formaldehyde resin, in order to improve the wet and dry strength of a polymer-bound glass fiber mat.

The problem faced by the inventors is the provision of an alternative method for flexibilizing a glass fiber nonwoven bound with a cured urea formaldehyde resin binder, particularly with lower levels of low-cost polymeric modifier and the need for improved strength over that provided by prior art methods. "Flexibilizing" herein is taken to be indicated by increased wet and dry strength and improved tear strength.

In a first aspect of the present invention there is provided a method for flexibilizing a glass fiber nonwoven bound with a cured urea formaldehyde resin binder comprising:

(a) admixing with water and a urea formaldehyde resin, 0.5–5% by weight, based on the weight of the urea formaldehyde resin, of a water-soluble polymer comprising 40–100% by weight, based on polymer weight, of a polymerized ethylenically unsaturated carboxylic acid monomer, the polymer having a weight average molecular weight from 100,000 to 500,00;

(b) applying the aqueous admixture to a glass fiber nonwoven; and (c) heating the admixture to at least 120 C.

Urea formaldehyde resins are well known and widely commercially available. They are formed from the reaction of urea and formaldehyde to form compounds containing methylol groups, which subsequently under the application of heat, with or without catalysts, react further, or condense, or cure to form polymers. The methylol groups in the resin are known to react with active hydrogen groups such as other methylol groups to form ether or methylene groups thereby forming polymeric structures. Such polymeric structures are generally brittle and nowovens containing such resins as binders tend to be relatively inflexible. Examples of commercially available urea formaldehyde resins include Casco-Resin FG-413F (Borden, Inc.) and GP TM 2980 RESI-MAT™ Glass Mat Binder Resin.

The water-soluble polymer contains 40–100% by weight, based on polymer weight, of at least one polymerized ethylenically unsaturated carboxylic acid monomer. The water-soluble polymer is formed by the free radical addition polymerization of the ethylenically unsaturated monomers such as, for example, methacrylic acid, acrylic acid, crotonic acid, fumaric acid, maleic acid, 2-methyl maleic acid, itaconic acid, 2-methyl itaconic acid, a,b-methylene glutaric acid, and salts thereof. Alternatively, ethylenically unsaturated anhydrides which form carboxylic acids during or subsequent to polymerization may be used in the polymerization such as, for example, maleic anhydride, itaconic anhydride, acrylic anhydride, and methacrylic anhydride. Additional ethylenically unsaturated monomer(s) may be copolymerized with the carboxylic acid monomer in an amount of 0–60% by weight, based on polymer weight, such as, for example, acrylic ester monomers including methyl acrylate, ethyl acrylate, butyl acrylate, 2-ethylhexyl acrylate, decyl acrylate, methyl methacrylate, butyl methacrylate, isodecyl methacrylate, hydroxyethyl acrylate, hydroxyethyl methacrylate, and hydroxypropyl methacrylate; acrylamide or substituted acrylamides; styrene or substituted styrenes; butadiene; vinyl acetate or other vinyl esters; acrylonitrile or methacrylonitrile; and the like. The optional additional ethylenically unsaturated monomer must be selected so as not to render the polymer insoluble in water; thus, only lesser amounts of hydrophobic monomers may be used while greater amounts of hydrophilic monomers may be used without compromising water solubility of the polymer.

The water-soluble polymer may be prepared by solution polymerization in an aqueous medium by techniques for polymerizing ethylenically-unsaturated monomers which are well known in the art. By "aqueous" herein is meant that the medium is predominantly composed of water although water-miscible organic solvents may also be present. The polymerization may be carried out by various means such as, for example, with all of the monomer in the reaction kettle at the beginning of the polymerization reaction or with some or all of the monomer being added throughout the course of the reaction.

The polymerization reaction to prepare the addition polymer may be initiated by various methods known in the art such as, for example, by using the thermal decomposition of an initiator and by using an oxidation-reduction reaction ("redox reaction") to generate free radicals to effect the polymerization.

The water-soluble polymer has a weight average molecular weight from 100,000 to 2,000,000, as measured by aqueous gel permeation chromatography. Molecular weights lower than a weight average molecular weight of 100,000 do not provide the strength improvements desired. Molecular weights higher than 2,000,000 lead to a higher viscosity of the aqueous admixture at a desirable solids level than is preferred for conventional methods of application of the aqueous dispersion to the nonwoven. Chain transfer agents such as mercaptans, polymercaptans, and halogen compounds may be used in the polymerization mixture in order to moderate the molecular weight of the water-soluble. Generally, from 0% to about 1% by weight, based on the weight of the polymeric binder, of $C_4$–$C_{20}$ alkyl mercaptans, mercaptopropionic acid, or esters of mercaptopropionic acid, may be used.

The aqueous admixture may be prepared by admixing water, the urea formaldehyde resin, and the water-soluble polymer using conventional mixing or stirring techniques to provide a homogeneous solution.

The aqueous admixture may contain, in addition, conventional adjuvants such as, for example, pigments, fillers, anti-migration aids, curing agents, neutralizers, coalescents, wetting agents, biocides, plasticizers, organosilanes, antifoaming agents, colorants, waxes, and anti-oxidants.

The aqueous admixture may be applied to a glass fiber nonwoven by conventional techniques such as, for example, air or airless spraying, padding, saturating, roll coating, curtain coating, beater deposition, coagulation, and the like. The amount of aqueous admixture which is applied is from 10–35% LOI.

The glass fiber nonwoven may be prepared from fibers of various length which may have been previously subjected to various treatment or primer steps. The glass fiber nonwoven may be of various thicknesses as appropriate for the desired end use and may have been formed by wet laid or dry laid processes. The glass fiber nonwoven may contain heat-resistant fibers other than glass, i.e., fibers which are substantially unaffected by exposure to temperatures above 120 C., such as, for example, aramid fibers, ceramic fibers, metal fibers, carbon fibers, polyimide fibers, certain polyester fibers, and rayon fibers. The nonwoven may also contain fibers which are not themselves heat resistant such as, for example, certain polyester fibers and nylon fibers, in so far as they do not adversely affect the performance of the nonwoven.

The aqueous admixture, after it is applied to a glass fiber nonwoven, is heated to effect drying and curing. The duration and temperature of heating will affect the rate of drying, processability, and handleability, and property development of the treated substrate. Heat treatment at about 120 C. to about 400 C. for a period of time between about 3 seconds to about 15 minutes may be carried out; treatment at about 150 C. to about 200 C. is preferred. The drying and curing functions may be effected in two or more distinct steps, if desired. For example, the composition may be first heated at a temperature and for a time sufficient to substantially dry but not to substantially cure the composition and then heated for a second time at a higher temperature and/or for a longer period of time to effect curing. Such a procedure, referred to as "B-staging", may be used to provide binder-treated nonwoven, for example, in roll form, which may at a later stage be cured, with or without forming or molding into a particular configuration, concurrent with the curing process.

The glass fiber nonwovens may be used for applications such as, for example, insulation batts or rolls, as reinforcing mat for roofing or flooring applications, as roving, as microglass-based substrate for printed circuit boards or battery separators, as filter stock, as tape stock, and as reinforcement scrim in cementitious and non-cementitious coatings for masonry.

EXAMPLES

Example 1 Preparation of aqueous admixture of urea formaldehyde resin and water soluble polymer.

Admixtures were prepared at 25% solids content with the binders adjusted to pH=5–5.5 before mixing. Quantities in grams are listed in Table 1.1.

Determination of weight average molecular weight

Weight average molecular weight was determined by aqueous gel permeation chromatography on polyacid samples using a polyacrylic acid standard. Samples which were not 100% polycarboxylic acid were hydrolyzed to polyacid at 180 C. for 60 hours in KOH/ethanol and the molecular weight determined on the resulting polyacid, followed by correction for the actual composition.

TABLE 1.1

Composition of aqueous admixtures

| Sample | Water-Sol. Polymer | Urea Formaldehyde Resin | Water |
|---|---|---|---|
| Comparative A | None | 386.4 | 463.6 |
| Comparative B | 9 (Acrylic Latex)[1] | 378.6 | 462.4 |
| Comparative C | 19.31 p(AA)[2] MW = 3500 | 378.6 | 452.1 |
| Comparative D | 35.4 p(AA)[3] MW = 60,000 | 378.6 | 443.0 |
| 1 | 38.6 p(46MAA/54EA)[4] MW = 300,000 | 378.6 | 432.8 |

Notes:
[1]-Acrylic water-insoluble Latex, weight of 47% solids latex;
[2]-weight of 22% solids solution;
[3]-weight of 12% solids solution;
[4]-weight of 11% solids solution.

Example 2. Preparation and evaluation of polymer-bound glass fiber nonwovens

Glass fiber nonwoven handsheets were prepared with Owens Corning Fiberglas, Inc. OCF K-786 1 inch length glass chop using approximately 7 grams of glass fiber per sheet. The glass fiber was dispersed in water using Magnifloc 1885A (from American Cyanamid Co) and Rhodameen VP-532 (from Rhone-Poulenc Chemical Co.) and handsheets were formed in a Williams handsheet mold. The wet sheet was transferred to a vacuum station, dewatered, the aqueous admixtures of Example 1 were applied, and excess was vacuumed off. The sheets were dried/cured in a forced air oven at 175 C. for 3 minutes. The binder amount on the samples was 22% LOI.

Determination of LOI

A three inch diameter piece of dried/cured fiberglass mat was cut using a circular die. The sample was weighed and then placed in a muffle furnace at 650 C. for 30 seconds. The sample was removed and then reweighed. % LOI was calculated using the equation: %LOI =(weight before burning-weight after burning)×100/weight before burning.

Tensile Strength Testing

Handsheets were cut into 1 inch by 4 inch strips for tensile testing and die-cut for tear testing. Tensile testing was performed on ten strips from each sample using a Thwing-Albert Intelect 500 tensile tester with a 200 lb. cell, 2 inch/min. jaw speed, 25% sensitivity, and a 2 inch gap. Dry tensile was performed on the prepared strips. For wet tensile testing the strips were first soaked in water for 20 minutes at 180 F. and tested immediately after removal while still wet.

Elmendorf Tear Strength Testing

Elmendorf tear strength was determined on die cut samples of dried/cured handsheet which were 1.5625 inches by 3 inches with a semi-circular convex cut on the top side of the rectangle such that the highest point of the semi-circle was 2.5 inches above the 3 inch base. A single ply sample was placed in a Thwing-Albert Tear Tester with a 1600 g. tear arm. The sample was then notched with a 0.75 inch cut and the arm was released. The tear strength was recorded in grams/ply. Data are presented in Table 2.1.

TABLE 2.1

Evaluation of glass fiber nonwovens bound using applied aqueous admixtures

| Sample | Dry Tensile (lb/in) | Wet Tensile (lb/in) | Elmendorf Tear (g/ply) |
|---|---|---|---|
| Comparative A | 38 | 17 | 280 |
| Comparative B | 35 | 20 | 290 |
| Comparative C | 37 | 13 | 282 |
| Comparative D | 36 | 16 | 310 |
| 1 | 45 | 22 | 295 |

Sample 1 of the method of this invention exhibits unexpectedly superior wet and dry tensile strength to all of the comparative samples and, in addition, improved tear strength to the unmodified urea formaldehyde resin-bound sample, Comparative A.

What is claimed is:

1. A method for flexibilizing a glass fiber nonwoven bound with a cured urea formaldehyde resin binder comprising:

(a) admixing with water and a urea formaldehyde resin, 0.5–5% by weight, based on the weight of said urea formaldehyde resin, of a water-soluble polymer comprising 40–100% by weight, based on polymer weight, of a polymerized ethylenically unsaturated carboxylic acid monomer, said polymer having a weight average molecular weight from 100,000 to 2,000,000;

(b) applying said aqueous admixture to a glass fiber nonwoven; and (c) heating said admixture to at least 120° C.

2. The method of claim 1 wherein said water-soluble polymer comprises a polymerized carboxylic acid monomer selected from the group consisting of methacrylic acid, acrylic acid, and mixtures thereof.

* * * * *